US008860191B2

(12) United States Patent
Ding et al.

(10) Patent No.: US 8,860,191 B2
(45) Date of Patent: Oct. 14, 2014

(54) ON-CHIP TRANSMISSION LINE STRUCTURES WITH BALANCED PHASE DELAY

(75) Inventors: Hanyi Ding, Colchester, VT (US); Kai D. Feng, Hopewell Junction, NY (US); Zhong-Xiang He, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 637 days.

(21) Appl. No.: 13/168,512

(22) Filed: Jun. 24, 2011

(65) Prior Publication Data

US 2012/0326798 A1 Dec. 27, 2012

(51) Int. Cl.
*H01L 23/66* (2006.01)
*H01P 1/18* (2006.01)
*H01L 23/522* (2006.01)

(52) U.S. Cl.
CPC ........ *H01L 23/5222* (2013.01); *H01L 23/5225* (2013.01); *H01L 2223/6638* (2013.01); *H01L 23/66* (2013.01); *H01P 1/184* (2013.01)
USPC .......................................... 257/664; 333/161

(58) Field of Classification Search
CPC ............. H01P 1/184; H01P 9/00; H03H 7/20; H01L 23/58; H01L 23/66
USPC .............. 257/664, 728; 333/1, 4, 5, 156, 161, 333/164
See application file for complete search history.

(56) References Cited

U.S. PATENT DOCUMENTS

| 5,448,208 | A | | 9/1995 | Honjo |
| 5,621,366 | A | * | 4/1997 | Gu et al. ........................ 333/204 |
| 5,633,479 | A | * | 5/1997 | Hirano .......................... 174/255 |
| 6,784,765 | B2 | * | 8/2004 | Yamada et al. ............... 333/193 |
| 6,800,929 | B1 | | 10/2004 | Nishijima |
| 2005/0052260 | A1 | | 3/2005 | Brown et al. |

* cited by examiner

*Primary Examiner* — Benny Lee
*Assistant Examiner* — Rakesh Patel
(74) *Attorney, Agent, or Firm* — Anthony J. Canale; Hoffman Warnick LLC

(57) ABSTRACT

A transmission wiring structure, associated design structure and associated method for forming the same. A structure is disclosed having: a plurality of wiring levels formed on a semiconductor substrate; a pair of adjacent first and second signal lines located in the wiring levels, wherein the first signal line comprises a first portion formed on a first wiring level and a second portion formed on a second wiring level; a primary dielectric structure having a first dielectric constant located between the first portion and a ground shield; and a secondary dielectric structure having a second dielectric constant different than the first dielectric constant, the secondary dielectric structure located between the second portion and the ground shield, and the second dielectric layer extending co-planar with the second portion and having a length that is substantially the same as the second portion.

18 Claims, 7 Drawing Sheets

ON-CHIP TRANSMISSION LINE STRUCTURES WITH BALANCED PHASE DELAY

BACKGROUND

The present invention relates to a structure, design structure and method for providing balanced/equal phase delay for on-chip transmission line circuits.

Differential signaling and I Q (in-phase and quadrature) signals used in electronic circuits and systems, such as amplifiers, modulators/mixers, receivers/transmitters etc., require an equal phase delay line pair to connect one device to another. Current solutions to ensure each transmission line has the same phase delay include laying out the line pair with the same physical length. However, for complicated on-chip circuits and systems, it is not always efficient or practical to obtain the same layout length for a line pair requiring equal/balanced phase delay. Accordingly, a solution is needed to achieve the same electrical phase delay for a line pair having unequal physical lengths in an on-chip environment.

BRIEF SUMMARY

In a first aspect, the invention provides a structure comprising: a plurality of wiring levels formed on a semiconductor substrate; a pair of adjacent first and second signal lines located in the wiring levels, wherein the first signal line comprises a first portion formed on a first wiring level and a second portion formed on a second wiring level; a primary dielectric structure having a first dielectric constant located between the first portion and a ground shield; and a secondary dielectric structure having a second dielectric constant different than the first dielectric constant, the secondary dielectric structure located between the second portion and the ground shield, and the second dielectric layer extending co-planar with the second portion and having a length that is substantially the same as the second portion.

In a second aspect, the invention provides a design structure embodied in a machine readable medium used in a design process for forming a transmission wiring circuit, the design structure comprising: a plurality of wiring levels formed on a semiconductor substrate; a pair of adjacent first and second signal lines located in the wiring levels, wherein the first signal line comprises a first portion formed on a first wiring level and a second portion formed on a second wiring level; a primary dielectric structure having a first dielectric constant located between the first portion and a ground shield; and a secondary dielectric structure having a second dielectric constant different than the first dielectric constant, the secondary dielectric structure located between the second portion and the ground shield, and the second dielectric layer extending co-planar with the second portion and having a length that is substantially the same as the second portion.

In a third aspect, the invention provides a method of forming a wiring structure having a plurality of wiring levels formed therein, comprising: obtaining a layout for a pair of signal lines in which a first signal line is shorter than a second signal line; implementing a wiring structure in which the first signal line comprises a first portion residing on a first wiring level and a second portion residing on a second wiring level; determining a primary dielectric material having a first dielectric constant that substantially encapsulates the wiring structure; selecting a secondary dielectric material having a second dielectric constant different than the first dielectric constant for placement between the second portion and a ground shield; and selecting dimensions of the secondary dielectric material to form a secondary dielectric structure to result in a matching phase delay for the pair of signal lines.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings.

Figure 1:
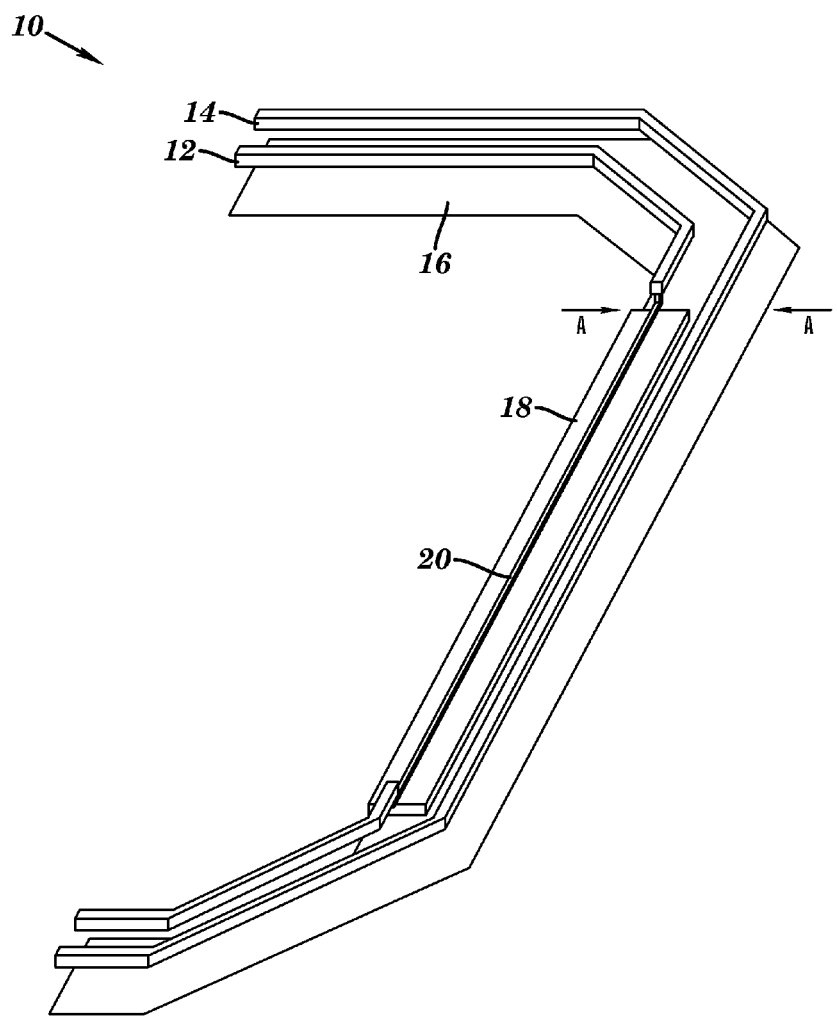
FIG. 1 depicts an isometric view of a wiring structure in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like reference numbering represents like elements.

DETAILED DESCRIPTION

As noted, transmission line structures consisting of two signal lines require equal and balanced phase delay in order to maintain signal integrity. In many cases, a +/−2 degree balance is a requirement. In cases where the length differs for the two signal lines, which often occurs in complex chip designs, the resulting phase delay created by the disparity is greater than +/−2 degrees. For instance, FIG. 1 depicts a relevant portion of an integrated circuit 10 having a pair of transmission lines 12 and 14, as well as a ground shield 16. As is evident, signal line 12 is shorter than signal line 14, which will result in an unbalanced signal.

In order to address this issue, the described embodiments incorporate a secondary dielectric structure 18 in between the shorter signal line 12 and ground shield 16, in which the secondary dielectric structure 18 has dielectric properties that are different from the existing dielectric material that encapsulates the signal lines. The dielectric properties are selected to alter the phase delay of the shorter line 12 to match the phase delay of the longer signal line 14.

The phase delay of a transmission line interconnect is proportional to sqrt(keff), where keff is the effective relative dielectric constant of the dielectric material in which the transmission line sits. Accordingly, two physically unequal transmission lines can be made to have equal/balanced phase delay by:

1) inserting a lower k dielectric block of a certain length and width between the signal line and ground shield of the longer line of the line pair; and/or 2) inserting a higher k dielectric block of certain length and width between the signal line and ground shield of the shorter line of the line pair.

In the embodiment shown in FIG. 1, the shorter transmission line 12 includes a secondary dielectric structure 18 having a higher k than the surrounding or primary dielectric structure that surrounds the wiring (not shown). Alternatively, or in addition to, a lower k dielectric could be placed below a portion of the longer signal line 14 to achieve a similar result. The specific dimensions (i.e., length, height and width) of the secondary dielectric structure can be selected, i.e., tuned, to achieve the desired result based on the above equation. For an integrated circuit mass production process, the dielectric layer thickness (or height) is normally predefined by the specific technology. This may limit the use of the height as a tuning parameter, especially if only one process mask is allowed to be added to minimize the cost.

It is recognized that including a secondary dielectric structure 18 will likely alter the characteristic impedance of line 12. In order to compensate for the change of impedance, a relocated line portion 20 of line 12, located coplanar to and above the secondary dielectric structure 18, is modified to use a lower metal layer with a width to give closest characteristic impedance to the original line structure. In this case, relocated line portion 20 is relocated from one metal layer, e.g., M5, to another metal layer, e.g., M4. This will not only maintain the closest line characteristic impedance as the original lines on M5, but also maintain the Design Rule Checker (DRC) rules.

Figure 2:
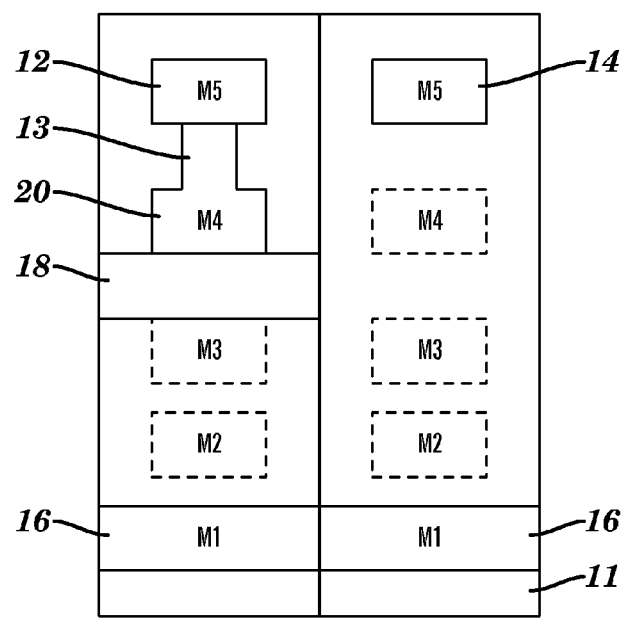
FIG. 2 depicts a cross-sectional view of the wiring structure of FIG. 1 in accordance with an embodiment of the present invention.

An illustrative cross-section A-A of integrated circuit 10 in FIG. 1 is shown in FIG. 2. As shown, a structure 11 is shown having a plurality of wiring levels, including five metal layers M1, M2, M3, M4 and M5, with M5 incorporating the transmission signal lines 12, 14 and M1 incorporating ground shield 16. A primary dielectric structure of a first type surrounds each of the metal layers. Secondary dielectric structure 18 is placed below signal line 12 and above a top surface of M1, in this case between the M3 and M4 metal layers. At the cross-section A-A, it can be seen that the signal line 12 is relocated from the M5 layer down to the M4 layer 20 with a vertical tap 13.

The secondary dielectric structure 18 has a dielectric constant different than the dielectric constant associated with the primary dielectric material of the primary dielectric structure. In addition, as shown in FIG. 1, the secondary dielectric structure 18 extends in a coplanar manner with the relocated line portion 20, such that the length of both the secondary dielectric structure 18 and relocated line portion 20 are substantially the same.

Figure 3:
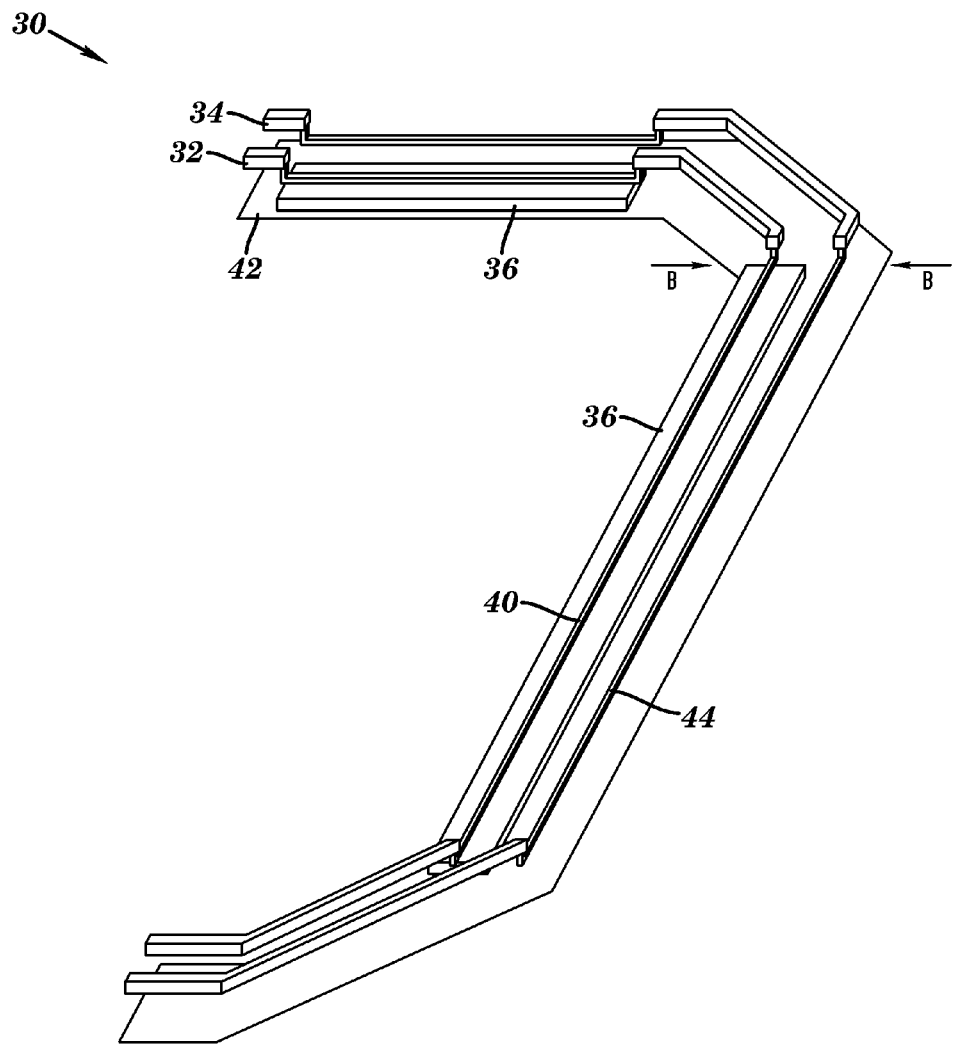
FIG. 3 depicts an isometric view of a wiring structure in accordance with an alternative embodiment of the present invention.
Figure 4:
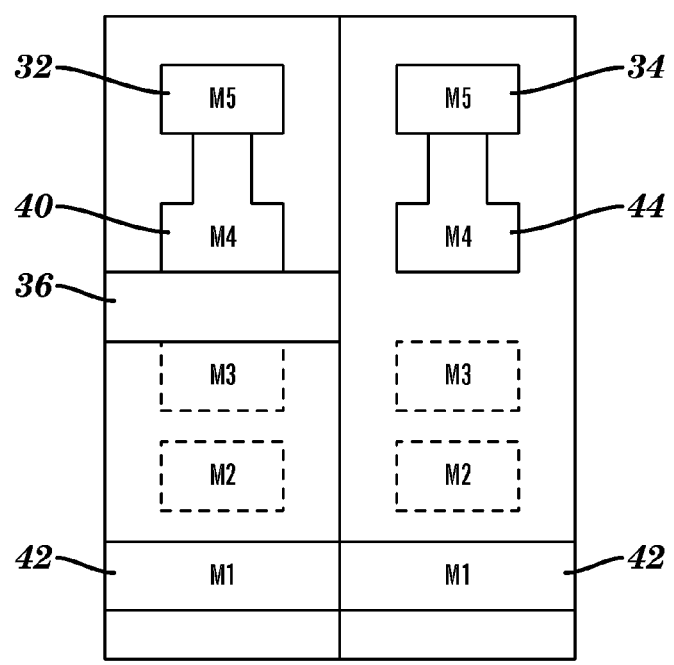
FIG. 4 depicts a cross-sectional view of the wiring structure of FIG. 3 in accordance with an embodiment of the present invention.

FIG. 3 depicts an alternative embodiment 30 in which both signal lines 32, 34 are moved down to the M4 layer above dielectric structures 36 for impedance control and better magnitude balance. FIG. 4 shows the accompanying view along cross-section B-B in which ground shield 16 again resides at the M1 layer, secondary dielectric structure 36 is placed between the M3 and M4 layers below signal line 32, and signal lines 32, 34 are moved down to the M4 level 40, 44 respectively. In this case, the primary dielectric structure remains between signal line 34 and the ground shield 42.

For the structures shown in FIGS. 1 and 2, the following experimental results were obtained. In the case where no secondary dielectric was inserted, and the signal lines were left intact on metal layer M5, there was about an 8.0 degree phase difference at 60 GHz between the two lines, with an amplitude difference of about 0.008 dB. In the embodiment shown in FIG. 1, in which a higher dielectric structure 18 was inserted below the shorter line 12 and line 12 was relocated to the M4 layer, the phase difference was reduced to about 0.2 degrees and resulted in an amplitude difference of about 0.135 dB. Finally, in the embodiment shown in FIG. 3, which included the insertion of two higher k dielectric blocks 36 and relocation of both signals lines to the M4 layer, a phase difference of 0.3 degrees was achieved with an amplitude difference of 0.075 dB.

As noted, rather than adding a higher k dielectric structure below the shorter signal line, a lower k dielectric structure could be added below the longer signal line. In such an approach, the line width in the lower k dielectric structure may need to be changed to maintain acceptable characteristic impedance. In some cases, the signal layer or ground shield layer of the modified portion may need to change to a different layer so that the DRC rules can be followed while maintaining acceptable line characteristic impedance. The length and width of the secondary dielectric structure are variables for obtaining the required reduced delay.

As an additional approach, both a higher k dielectric and a lower k dielectric could be added to the short signal line and long signal line, respectively.

Figure 5:
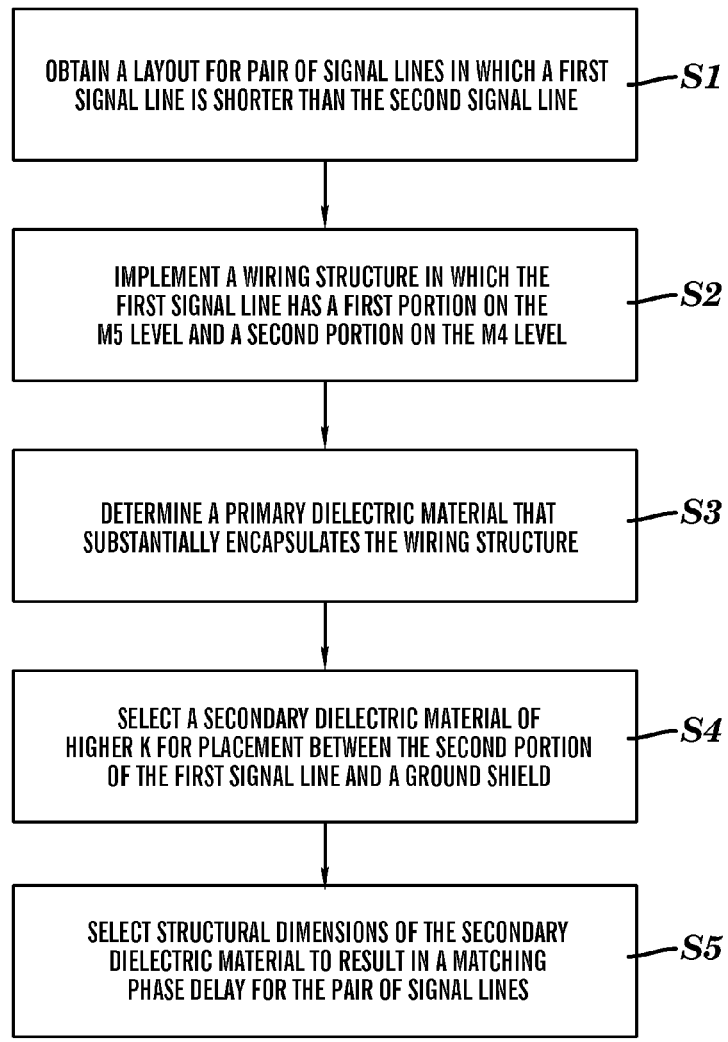
FIG. 5 depicts a flow diagram showing a method of forming a wiring structure in accordance with an embodiment of the present invention.

FIG. 5 depicts a flow diagram showing a method of forming a wiring structure as described herein. At S1, a layout for a pair of signal lines is obtained in which a first signal line is shorter than a second signal line. At S2, a wiring structure is implemented in which the first signal line has a first portion on a first wiring level, e.g., M5, and a second portion on a second wiring level, e.g., M4, as shown in FIG. 1. Note that the wiring structure may be implemented on any two different wiring levels, and M5 and M4 are intended to describe one illustrative embodiment. Next, at S3, the primary dielectric material that will be used to substantially encapsulate the wiring structure is determined (i.e., selected, obtained, inputted, etc.). At S4, a secondary dielectric material is selected having a higher dielectric constant k for placement between the second portion of the first signal line and the ground shield. At S5, structural dimensions (e.g., length, height, width) of the secondary dielectric material are selected to form a structure that will result in the same phase delay for the first and second signal lines.

Figure 6:
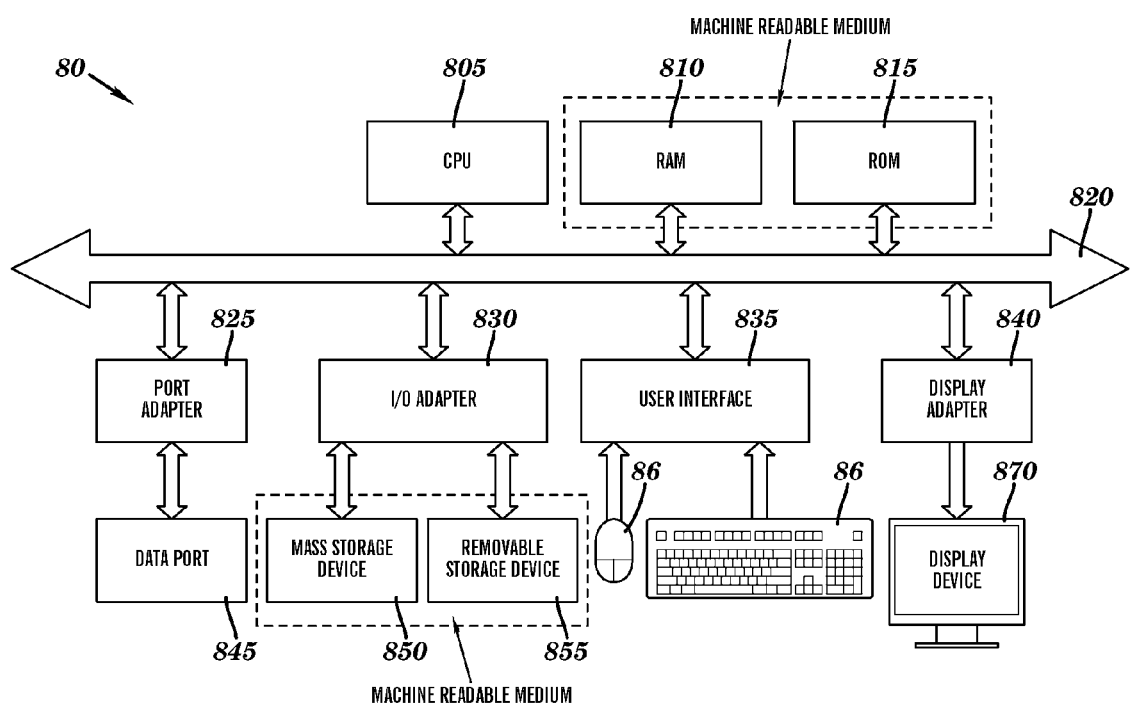
FIG. 6 depicts a block diagram of a general-purpose computer system in accordance with an embodiment of the present invention.

FIG. 6 illustrates a block diagram of a general-purpose computer system which can be used to implement the circuit and circuit design structure described herein. The design structure may be coded as a set of instructions on removable or hard media for use by general-purpose computer. FIG. 6 is a schematic block diagram of a general-purpose computer for practicing the present invention. FIG. 6 shows a computer system 800, which has at least one microprocessor or central processing unit (CPU) 805. CPU 805 is interconnected via a system bus 820 to machine readable media 875, which includes, for example, a random access memory (RAM) 810, a read-only memory (ROM) 815, a removable and/or program storage device 855 and a mass data and/or program storage device 850. An input/output (I/O) adapter 830 connects mass storage device 850 and removable storage device 855 to system bus 820. A user interface 835 connects a keyboard 865 and a mouse 860 to system bus 820, and a port adapter 825 connects a data port 845 to system bus 820 and a display adapter 840 connect a display device 870. ROM 815 contains the basic operating system for computer system 800. Examples of removable data and/or program storage device 855 include magnetic media such as floppy drives, tape drives, portable flash drives, zip drives, and optical media such as CD ROM or DVD drives. Examples of mass data and/or program storage device 850 include hard disk drives and non-volatile memory such as flash memory. In addition to keyboard 865 and mouse 860, other user input devices such as trackballs, writing tablets, pressure pads, microphones, light pens and position-sensing screen displays may be connected to user interface 835. Examples of display device 870 include cathode-ray tubes (CRT) and liquid crystal displays (LCD).

A machine readable computer program may be created by one of skill in the art and stored in computer system 800 or a data and/or any one or more of machine readable medium 875 to simplify the practicing of this invention. In operation, information for the computer program created to run the present invention is loaded on the appropriate removable data and/or program storage device 855, fed through data port 845 or entered using keyboard 865. A user controls the program by manipulating functions performed by the computer program and providing other data inputs via any of the above mentioned data input means. Display device 870 provides a means for the user to accurately control the computer program and perform the desired tasks described herein.

Figure 7:
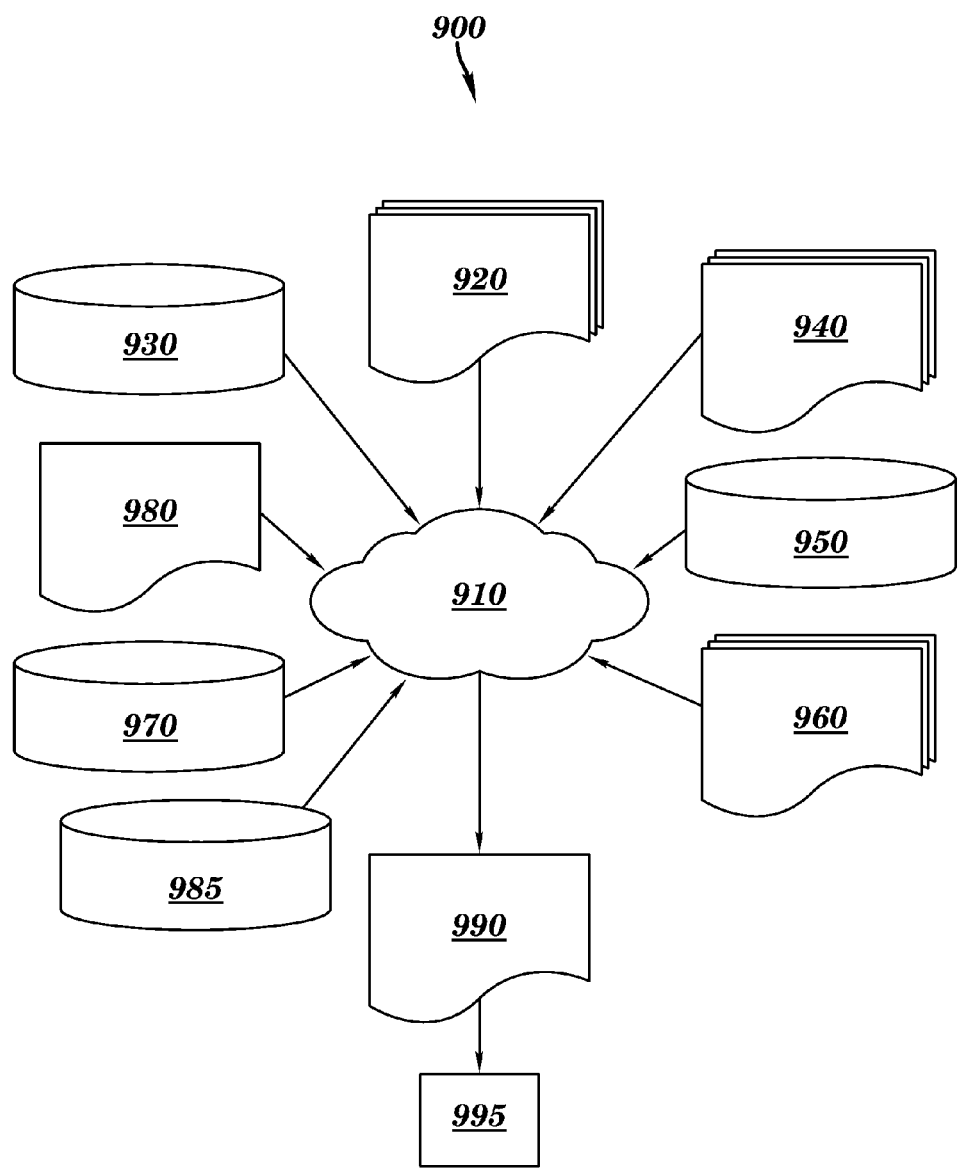
FIG. 7 depicts a block diagram of a design flow used in semiconductor design, manufacturing, and/or test in accordance with an embodiment of the present invention.

FIG. 7 shows a block diagram of an example design flow 900. Design flow 900 may vary depending on the type of IC being designed. For example, a design flow 900 for building an application specific IC (ASIC) will differ from a design flow 900 for designing a standard component. Design structure 920 is an input to a design process 910 and may come from an IP provider, a core developer, or other design company. Design structure 920 comprises circuit 100 in the form of schematics or HDL, a hardware-description language, (e.g., Verilog, VHDL, C, etc.). Design structure 920 may be on one or more of machine readable medium 875 as shown in FIG. 6. For example, design structure 920 may be a text file or a graphical representation of circuit 100. Design process 910 synthesizes (or translates) circuit 100 into a netlist 980, where netlist 980 is, for example, a list of wires, transistors, logic gates, control circuits, I/O, models, etc. and describes the connections to other elements and circuits in an integrated circuit design and recorded on at least one of machine readable medium 875.

Design process 910 includes using a variety of inputs; for example, inputs from library elements 930 which may house a set of commonly used elements, circuits, and devices, including models, layouts, and symbolic representations, for a given manufacturing technology (e.g. different technology nodes, 32 nm, 45 nm, 90 nm, etc.), design specifications 940, characterization data 950, verification data 960, design rules 970, and test data files 985, which may include test patterns and other testing information. Design process 910 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 910 without deviating from the scope and spirit of the invention.

Ultimately design process 910 translates circuit 100, along with the rest of the integrated circuit design (if applicable), into a final design structure 990 (e.g., information stored in a GDS storage medium). Final design structure 990 may comprise information such as, for example, test data files, design content files, manufacturing data, layout parameters, wires, levels of metal, vias, shapes, test data, data for routing through the manufacturing line, and any other data required by a semiconductor manufacturer to produce circuit 100. Final design structure 990 may then proceed to a stage 995 of design flow 900, where stage 995 is, for example, where final design structure 990 proceeds to tape-out, is released to manufacturing, is sent to another design house or is sent back to the customer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure comprising:
a plurality of wiring levels formed on a semiconductor substrate;
a pair of adjacent first and second signal lines located in the plurality of wiring levels, wherein the first signal line comprises a first portion formed on a first wiring level and a second portion formed on a second wiring level;
a primary dielectric structure having a first dielectric constant located between the first portion and a ground shield; and
a secondary dielectric structure having a second dielectric constant different than the first dielectric constant, the secondary dielectric structure located between the second portion and the ground shield, and the second dielectric structure extending co-planar with the second portion and having a length that is substantially the same as the second portion, wherein the first signal line has a length that is different than a length of the second signal line; and, the second portion and the secondary dielectric structure are arranged to provide the same phase delay and same characteristic impedance for the first and second signal lines.

2. The structure of claim 1, wherein the second dielectric constant is higher than the first dielectric constant.

3. The structure of claim 1, wherein the second signal line is located entirely on the first wiring level.

4. The structure of claim 1, wherein the second signal line comprises corresponding first and second portions which are adjacent to the first and second portions of the first signal line; and, the primary dielectric structure is located between the second portion of the second signal line and the ground shield.

5. The structure of claim 1, wherein the first portion resides on an M5 layer and the second portion resides on an M4 layer.

6. The structure of claim 1, wherein the ground shield resides at an M1 layer.

7. A non-transitory machine readable medium having a program product thereon for forming a transmission wiring circuit of a design structure, comprising:
program code for forming a plurality of wiring levels formed on a semiconductor substrate;

program code for forming a pair of adjacent first and second signal lines located in the plurality of wiring levels, wherein the first signal line comprises a first portion formed on a first wiring level and a second portion formed on a second wiring level;

program code for forming a primary dielectric structure having a first dielectric constant located between the first portion and a ground shield; and program code for forming a secondary dielectric structure having a second dielectric constant different than the first dielectric constant, the secondary dielectric structure located between the second portion and the ground shield, and the second dielectric structure extending co-planar with the second portion and having a length that is substantially the same as the second portion, wherein the first signal line has a length that is different than a length of the second signal line; and, the second portion and the secondary dielectric structure are arranged to provide the same phase delay and same characteristic impedance for the first and second signal lines.

8. The non-transitory machine readable medium of claim 7, wherein the second dielectric constant is higher than the first dielectric constant.

9. The non-transitory machine readable medium of claim 7, wherein the design structure comprises a netlist, which describes the transmission wiring circuit.

10. The non-transitory machine readable medium of claim 7, wherein the design structure resides on a GDS storage medium.

11. The non-transitory machine readable medium of claim 7, wherein the design structure includes at least one item selected from the group consisting of test data files, characterization data, verification data, and design specifications.

12. The non-transitory machine readable medium of claim 7, wherein the second signal line comprises corresponding first and second portions which are adjacent to the first and second portions of the first signal line; and, the primary dielectric structure is located between the second portion of the second signal line and the ground shield.

13. The non-transitory machine readable medium of claim 7, wherein the second signal line is located entirely on the first wiring level.

14. A method of forming a wiring structure having a plurality of wiring levels formed therein, comprising:

obtaining a layout for a pair of signal lines in which a first signal line is shorter than a second signal line;

implementing a wiring structure in which the first signal line comprises a first portion residing on a first wiring level and a second portion residing on a second wiring level;

determining a primary dielectric material having a first dielectric constant that substantially encapsulates the wiring structure;

selecting a secondary dielectric material having a second dielectric constant different than the first dielectric constant for placement between the second portion and a ground shield; and selecting dimensions of the secondary dielectric material to form a secondary dielectric structure to result in a matching phase delay for the pair of signal lines.

15. The method of claim 14, wherein the secondary dielectric structure extends co-planar with the second portion and has a length that is substantially the same as the second portion.

16. The method of claim 14, wherein the second signal line is located entirely on the first wiring level.

17. The method of claim 14, wherein the second signal line comprises corresponding first and second portions which substantially follow the first and second portions of the first signal line; and, the primary dielectric material is located between the second portion of the second signal line and the ground shield.

18. The method of claim 14, wherein the second dielectric constant is higher than the first dielectric constant.

* * * * *